United States Patent
Shiraishi et al.

(10) Patent No.: US 9,240,797 B2
(45) Date of Patent: Jan. 19, 2016

(54) POWER SUPPLY NOISE CANCELLING CIRCUIT AND POWER SUPPLY NOISE CANCELLING METHOD

(71) Applicant: KABUSHIKI KAISHA TOSHIBA, Minato-ku, Tokyo (JP)

(72) Inventors: Kei Shiraishi, Fuchu Tokyo (JP); Masanori Furuta, Odawara Kanagawa (JP); Junya Matsuno, Kawasaki Kanagawa (JP); Tetsuro Itakura, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/657,728

(22) Filed: Mar. 13, 2015

(65) Prior Publication Data

US 2015/0263746 A1 Sep. 17, 2015

(30) Foreign Application Priority Data

Mar. 14, 2014 (JP) .................... 2014-051796

(51) Int. Cl.
*H03M 1/66* (2006.01)
*H03M 1/08* (2006.01)
*H03M 1/00* (2006.01)

(52) U.S. Cl.
CPC ............ *H03M 1/0836* (2013.01); *H03M 1/001* (2013.01); *H03M 1/665* (2013.01)

(58) Field of Classification Search
CPC ... H03M 1/0836; H03M 1/001; H03M 1/665; H03M 1/66
USPC ........................................................ 341/144
See application file for complete search history.

(56) References Cited

U.S. PATENT DOCUMENTS

| 5,554,987 | A | * | 9/1996 | Ooga | 341/147 |
| 7,688,098 | B2 | * | 3/2010 | Kajita | 324/750.3 |
| 8,675,891 | B2 | * | 3/2014 | Odaohhara et al. | 381/94.1 |
| 8,836,384 | B1 | * | 9/2014 | Oh et al. | 327/109 |
| 8,945,115 | B2 | * | 2/2015 | Gilbert et al. | 606/38 |
| 2006/0092062 | A1 | | 5/2006 | Pan | |
| 2012/0071114 | A1 | | 3/2012 | Kurose | |
| 2013/0214953 | A1 | | 8/2013 | Shiraishi et al. | |

FOREIGN PATENT DOCUMENTS

| JP | 2011015069 A | 1/2011 |
| JP | 2012070088 A | 4/2012 |
| JP | 2013172421 A | 9/2013 |

OTHER PUBLICATIONS

Ippei Akita, "Current-Steering Digital-to-Analog Converter With a High-PSRR Current Switch", IEEE Transactions on Circuits and Systems-II: Express Briefs, col. 58, No. 11, Nov. 2011, pp. 724-728.

* cited by examiner

*Primary Examiner* — Brian Young
(74) *Attorney, Agent, or Firm* — Holtz, Holtz, Goodman & Chick PC

(57) ABSTRACT

According to an embodiment, a power supply noise cancelling circuit includes a generator, a first multiplier, a subtractor and a digital-to-analog converter. The generator generates a sine wave signal. The first multiplier multiplies a digital input signal by a digital signal based on the sine wave signal to generate a first digital product signal. The subtractor subtracts a digital signal based on the first digital product signal from the digital input signal to generate a digital difference signal. The digital-to-analog converter performs a digital-to-analog conversion on the digital difference signal to obtain an analog output signal.

8 Claims, 7 Drawing Sheets

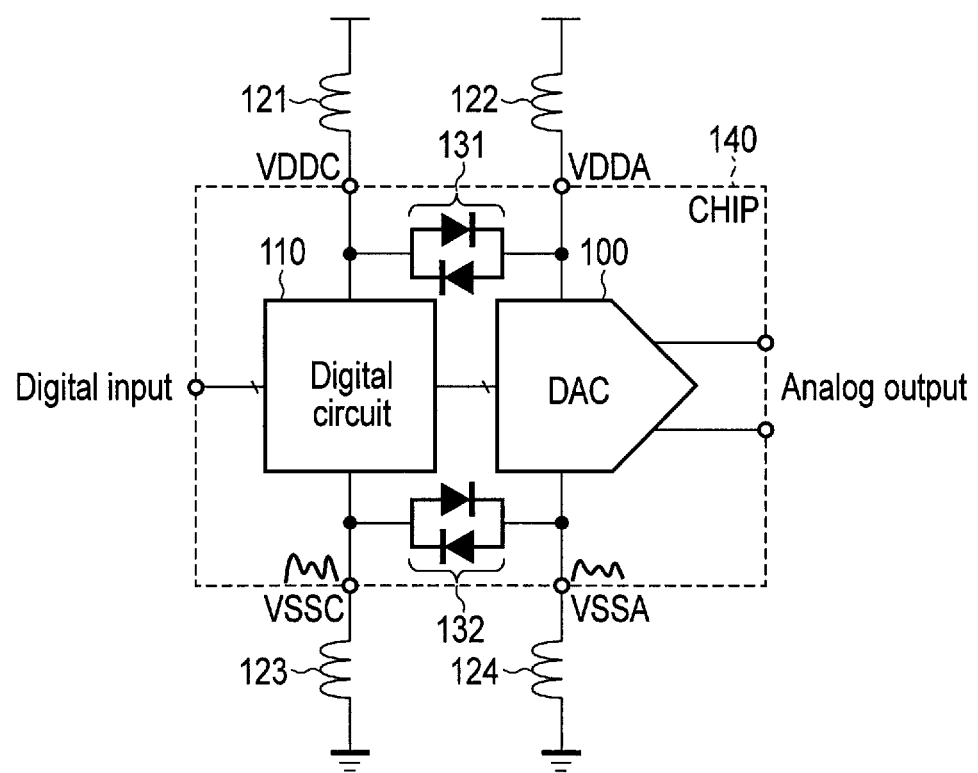
F I G. 1

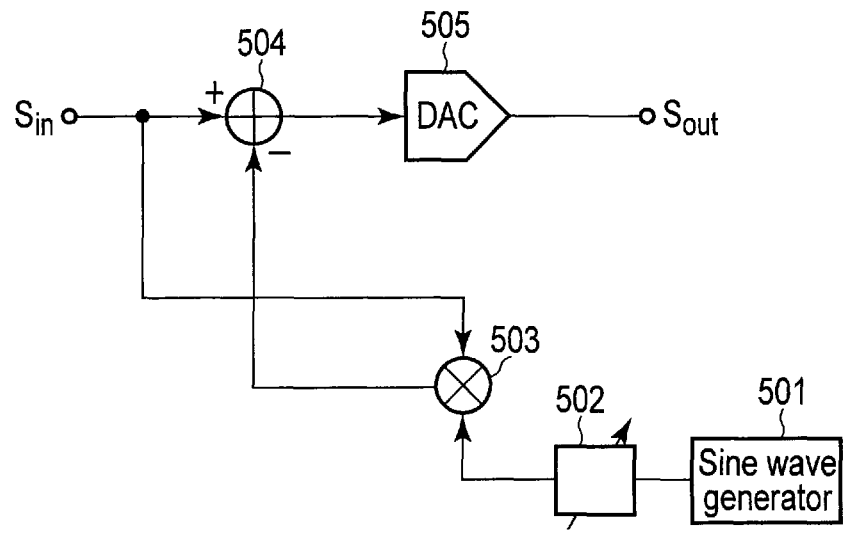
F I G. 5
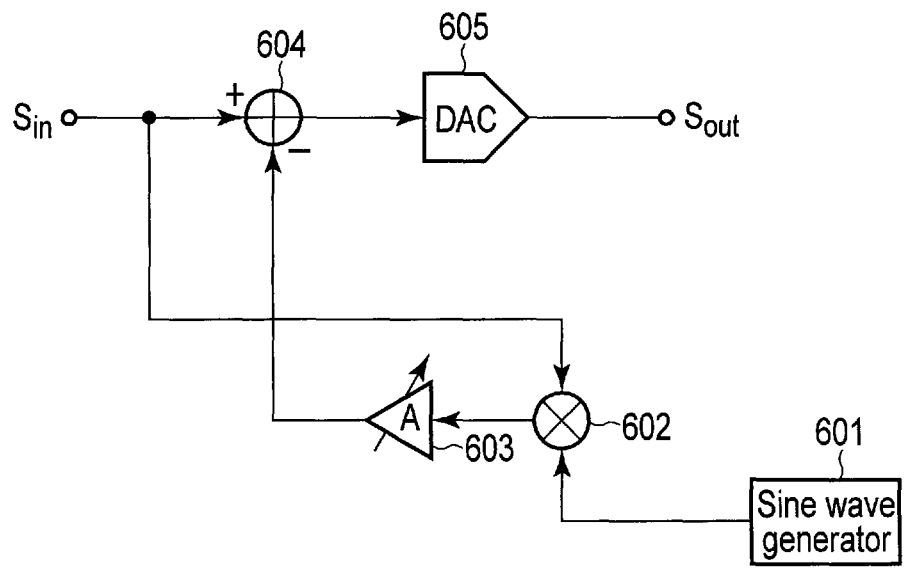
F I G. 6

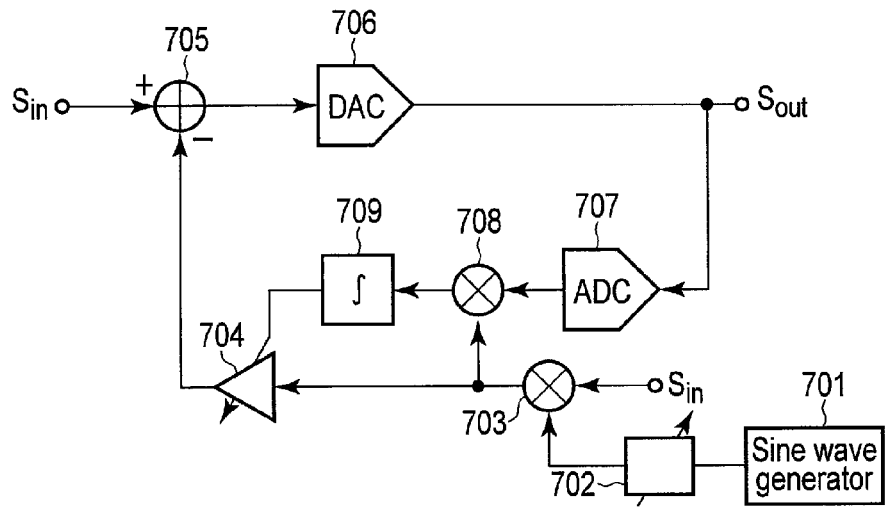
F I G. 7
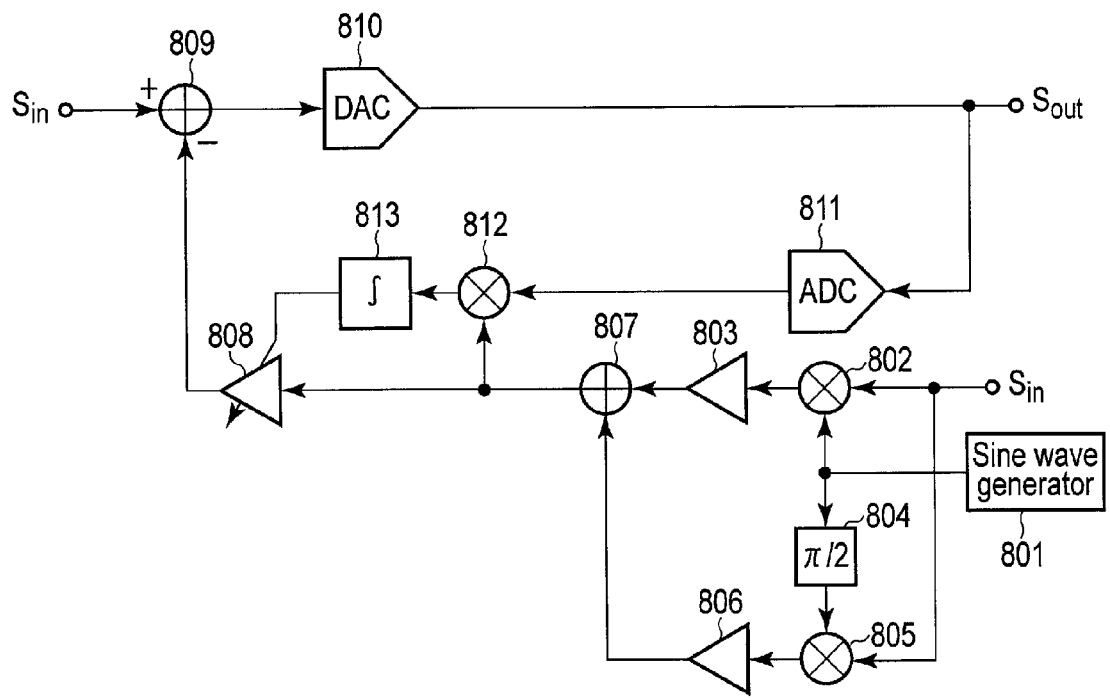
F I G. 8

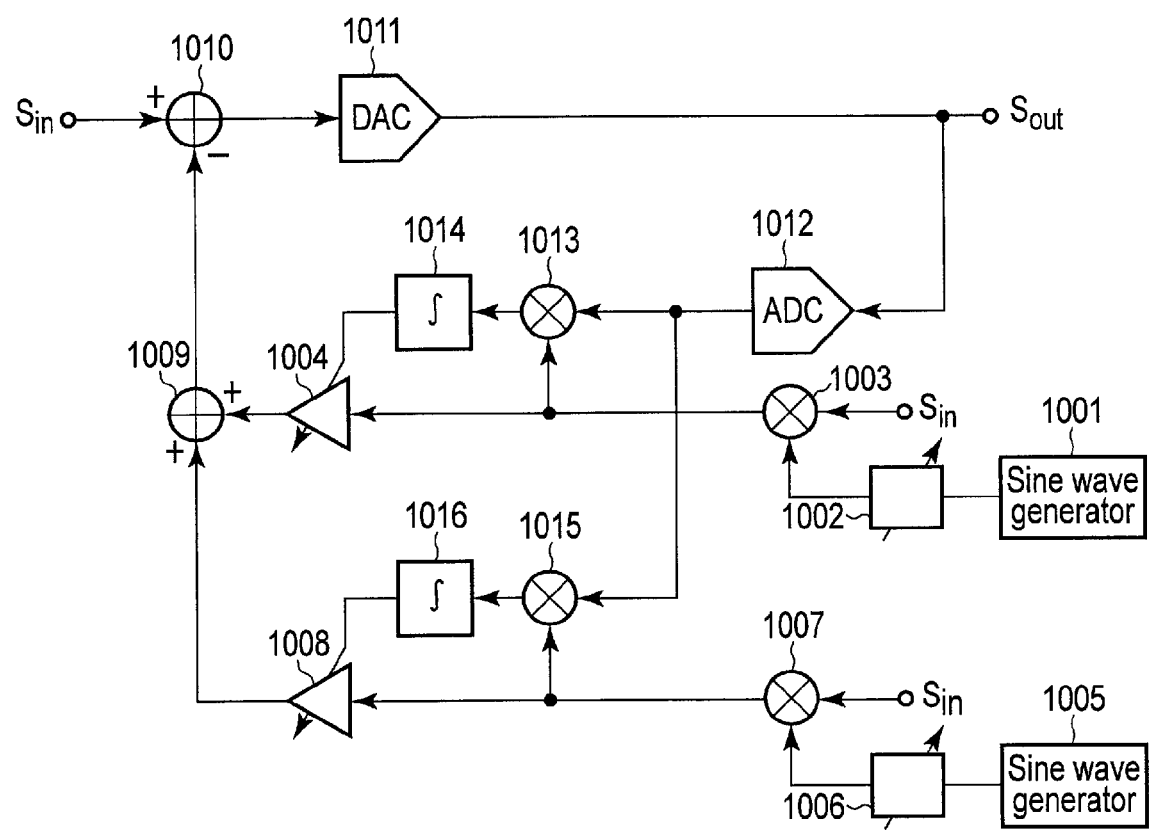
F I G. 10

POWER SUPPLY NOISE CANCELLING CIRCUIT AND POWER SUPPLY NOISE CANCELLING METHOD

CROSS-REFERENCE TO RELATED APPLICATIONS

This application is based upon and claims the benefit of priority from Japanese Patent Application No. 2014-051796, filed Mar. 14, 2014, the entire contents of which are incorporated herein by reference.

FIELD

Embodiments relate to a technique for canceling power supply noise.

BACKGROUND

An analog/digital mixed circuit is known in which an analog circuit and a digital circuit are disposed on one circuit. The analog circuit and the digital circuit are coupled together via a data converter such as an analog-to-digital converter (ADC) or a digital-to-analog converter (DAC) which is disposed on the same chip. For example, when the digital circuit and the DAC are disposed on the same chip, a fluctuation in a power supply voltage for the digital circuit may propagate to the DAC as power supply noise and degrade the resolution of the DAC.

BRIEF DESCRIPTION OF THE DRAWINGS

FIG. 1 is a diagram illustrating an analog/digital mixed circuit;

FIG. 5 is a diagram illustrating a power supply noise cancelling circuit according to a second embodiment;

FIG. 6 is a diagram illustrating a power supply noise cancelling circuit according to a third embodiment;

FIG. 7 is a diagram illustrating a power supply noise cancelling circuit according to a fourth embodiment;

FIG. 8 is a diagram illustrating a power supply noise cancelling circuit according to a fifth embodiment;

FIG. 10 is a diagram illustrating a power supply noise cancelling circuit according to a seventh embodiment.

DETAILED DESCRIPTION

Figure 2:
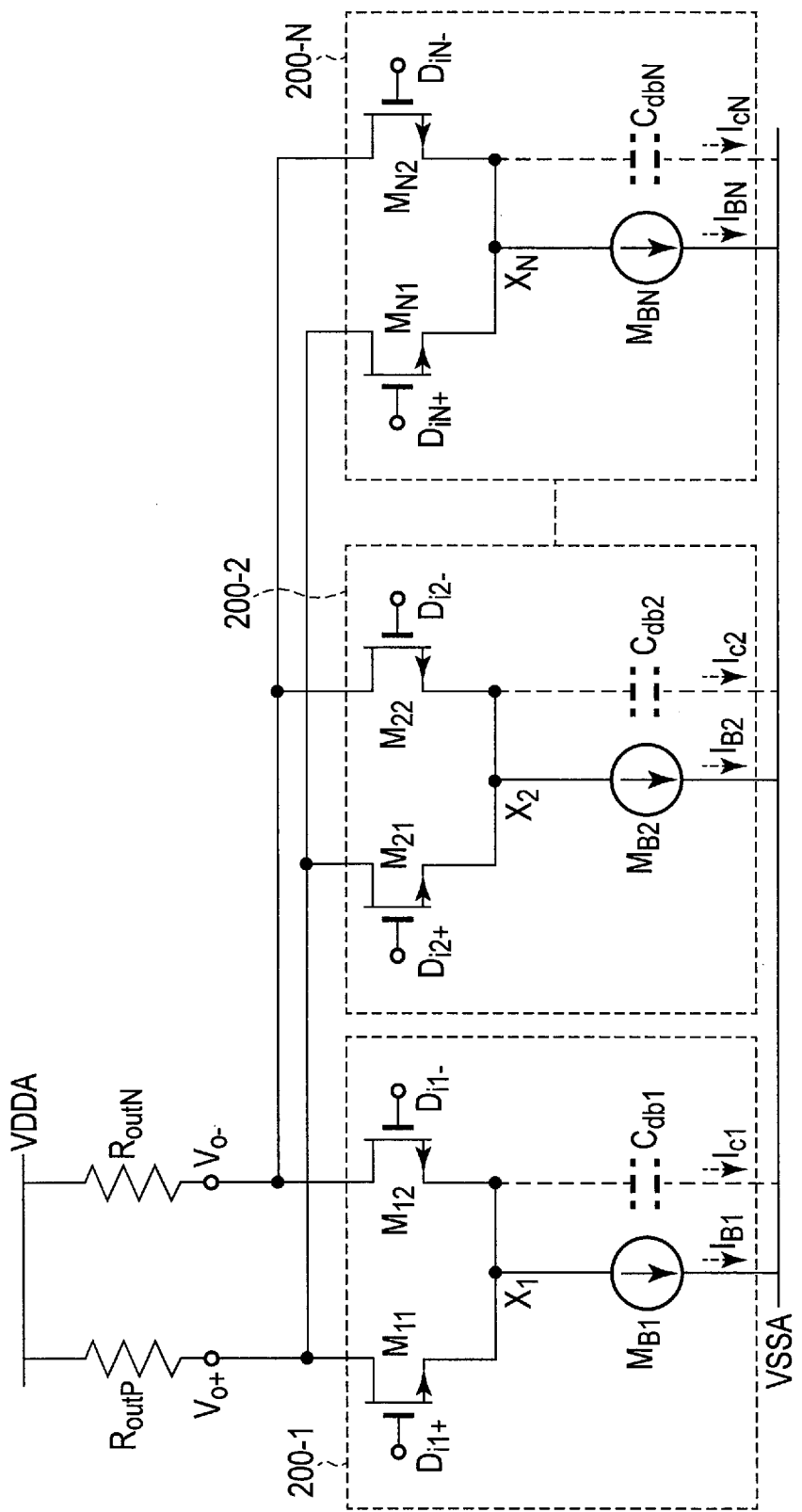
FIG. 2 is a circuit diagram illustrating an N-bit current steering DAC.

Embodiments will be described below with reference to the drawings.

According to an embodiment, a power supply noise cancelling circuit includes a generator, a first multiplier, a subtractor and a digital-to-analog converter. The generator generates a sine wave signal. The first multiplier multiplies a digital input signal by a digital signal based on the sine wave signal to generate a first digital product signal. The subtractor subtracts a digital signal based on the first digital product signal from the digital input signal to generate a digital difference signal. The digital-to-analog converter performs a digital-to-analog conversion on the digital difference signal to obtain an analog output signal.

Elements identical or similar to corresponding described elements are hereinafter denoted by identical or similar reference numerals, and duplicate descriptions are basically omitted.

First Embodiment

In an analog/digital mixed circuit in which a DAC 100 and a digital circuit 110 are disposed on one chip 140 as illustrated in FIG. 1, a fluctuation in a power supply voltage for the digital circuit 110 may propagate to the DAC 100 as power supply noise.

A power supply node VDDC of the digital circuit 110 is connected to a power supply via a bonding wire 121. A ground node VSSC of the digital circuit 110 is connected to ground via a bonding wire 123. Similarly, a power supply node VDDA of the DAC 100 is connected to the power supply via a bonding wire 122. A ground node VSSA of the DAC 100 is connected to ground via a bonding wire 124.

Moreover, the power supply node VDDC of the digital circuit 110 and the power supply node VDDA of the DAC 100 are connected together via a back-to-back diode 131. Similarly, the ground node VSSC of the digital circuit 110 and the ground node VSSA of the DAC 100 are connected together via a back-to-back diode 132.

The bonding wire 121 and the bonding wire 123 each include an inductance component, and thus, an AC (Alternating Current) current flows through the bonding wire 121 and the bonding wire 123 while the digital circuit 110 is in operation. The AC current fluctuates the voltage of the power supply node VDDC of the digital circuit 110 and the voltage of the ground node VSSC of the digital circuit 110. The fluctuation in voltage propagates through the back-to-back diode 131, the back-to-back diode 132, and a substrate to the power supply node VDDA of the DAC 100 and the ground node VSSA as power supply noise.

Figure 4:
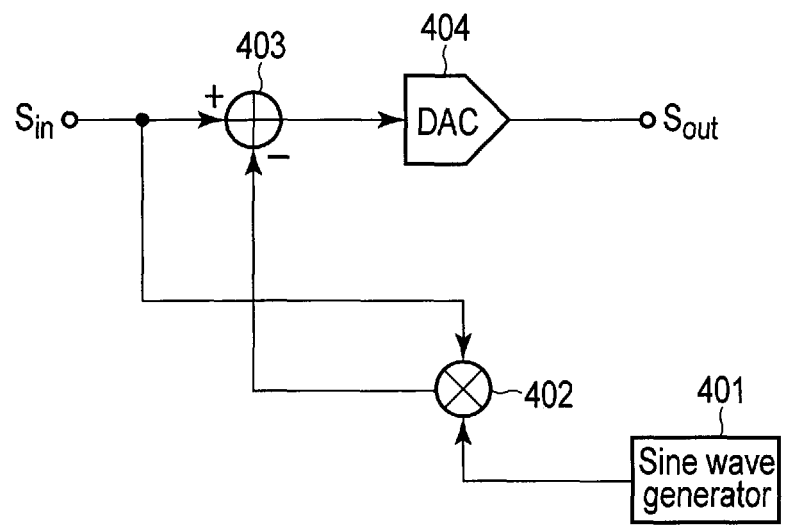
FIG. 4 is a diagram illustrating a power supply noise cancelling circuit according to a first embodiment.

With such power supply noise taken into account, the power supply noise cancelling circuit according to the first embodiment pre-processes an input signal to the DAC to prevent a decrease in the resolution of the DAC. Specifically, as illustrated in FIG. 4, the power supply noise cancelling circuit according to the first embodiment includes a sine wave generator 401, a multiplier 402, a subtractor 403, and a DAC 404.

The sine wave generator 401 generates a sine wave signal $N_1$ that simulates power supply noise provided to the DAC 404 by a digital circuit (not depicted in the drawings), in a frequency component, an amplitude component, and a phase component of the signal. As described below, appropriate design of the frequency component $f_1$, amplitude component $A_1$, phase component $\phi_1$ of the sine wave signal $N_1$ allows a power supply noise component to be effectively canceled through signal processing performed by the DAC 404. The sine wave generator 401 outputs the sine wave signal $N_1$ to the multiplier 402.

Wideband design is needed for, for example, a data converter such as an ADC or a DAC which is included an analog/digital mixed circuit used for a high rate wireless communication system. Thus, the DAC is generally designed to operate based on a high sampling frequency. On the other hand, it is difficult to design the digital circuit connected to the DAC so that the digital circuit operates as fast as the DAC. Hence, typically, the digital circuit is supplied with a low-speed clock resulting from division of the frequency of a high-speed clock for the DAC. That is, an operating frequency of the digital circuit connected to the DAC 404 is often known at the time of design of the digital circuit in FIG. 1. In the power supply noise in the DAC, the operating frequency or a frequency component equal to double the operating frequency is dominant.

Thus, the frequency component f1 can be designed, for example, to be equal to the operating frequency or the double thereof. Furthermore, when the amplitude component and phase component of the power supply noise are also known, the amplitude component $A_1$ and phase component $\phi_1$ may be designed to be equal to these known values.

The multiplier 402 receives a digital input signal $S_{in}$ and also receives sine wave signal $N_1$ from the sine wave generator 401. The multiplier 402 multiplies the digital input signal $S_{in}$ by the sine wave signal $N_1$ to obtain a digital product signal $S_{in}N_1$. The multiplier 402 outputs the digital product signal $S_{in}N_1$ to the subtractor 403.

The subtractor 403 receives the digital input signal $S_{in}$ and also receives the digital product signal $S_{in}N_1$ from the multiplier 402. The subtractor 403 subtracts the digital product signal $S_{in}N_1$ from the digital input signal $S_{in}$ to obtain a digital difference signal $(S_{in}-S_{in}N_1)$. The subtractor 403 outputs the digital difference signal $(S_{in}-S_{in}N_1)$ to the DAC 404.

The DAC 404 receives the digital difference signal $(S_{in}-S_{in}N_1)$ from the subtractor 403. The DAC 404 performs a digital-to-analog conversion on the digital difference signal $(S_{in}-S_{in}N_1)$ to obtain an analog output signal $S_{out}$. The analog output signal $S_{out}$ corresponds to a desired wave component resulting from removal of a power supply noise component (that is, undesired wave component) from the digital input signal $S_{in}$.

Specifically, the DAC 404 may be, for example, a current steering DAC. An N-bit current steering DAC is illustrated in FIG. 2. The N-bit current steering DAC in FIG. 2 includes N current switching cells 200-1, 200-2, . . . , 200-N. The N current switching cells 200-1, 200-2, . . . , 200-N receive corresponding 1-bit digital signals in an input digital signal (N bits), respectively. For example, the current switching cell 200-1 receives a 1-bit digital signal and an inverse signal thereof at gate terminals of a MOS (Metal Oxide Semiconductor) transistor M11 and a MOS transistor M12 serving as a switch transistor pair. Depending on whether the 1-bit digital signal is at a high level or a low level, one of the MOS transistors M11 and M12 is turned on, while the other is turned off. Hence, ideally, a current of the same magnitude as that of a current $I_{B1}$ flowing through a current source $M_{B1}$ flows though one of output terminals $V_{o+}$ and $V_{o-}$ in accordance with Kirchhoff's current law. The other current switch cells operate similarly, and thus, the difference between a current flowing through the output terminal $V_{o+}$ and a current flowing though the output terminal $V_{o-}$ is an amount corresponding to the digital input signal. An output resistor $R_{outP}$ and an output resistor $R_{outN}$ converts the currents into respective voltages to generate an analog output signal corresponding to the digital input signal.

However, the resolution of the N-bit current steering DAC in FIG. 2 may be degraded due to the adverse effect of the power supply noise. For example, it is assumed that the MOS transistor M11 of the current switching cell 200-1 is on, while the MOS transistor M12 is off. In this case, the MOS transistor M11 and the current source $M_{B1}$ form a source follower in which the gate terminal of the MOS transistor M11 serves as an input. Hence, the voltage of the gate terminal of the MOS transistor M11 is transmitted to a node X with a near unity gain. That is, when the voltage of the gate terminal of the MOS transistor M11 fluctuates due to the adverse effect of the power supply noise, the voltage of the node X fluctuates to the same degree. The fluctuation in the voltage of the node X causes an excess current $I_{C1}$ through a parasitic capacitance $C_{db1}$. Since the MOS transistor M12 is off, a current $(I_{B1}+I_{C1})$ flows through the MOS transistor M11 in accordance with Kirchhoff's current law. The excess current $I_{C1}$ may be added to a current flowing through the output terminal $V_{o+}$ as an error, causing the resolution of the N-bit current steering DAC in FIG. 2 to be degraded. Similar problems may occur in the other current switching cells 201-2, . . . , 201-N. The analog output signal generated by the N-bit current steering DAC in FIG. 2 is a differential signal, but the sums of the excess currents flowing through the output terminal $V_{o+}$ and the output terminal $V_{o-}$ are not even. Thus, an error voltage resulting from the excess currents remains in the analog output signal.

Figure 3:
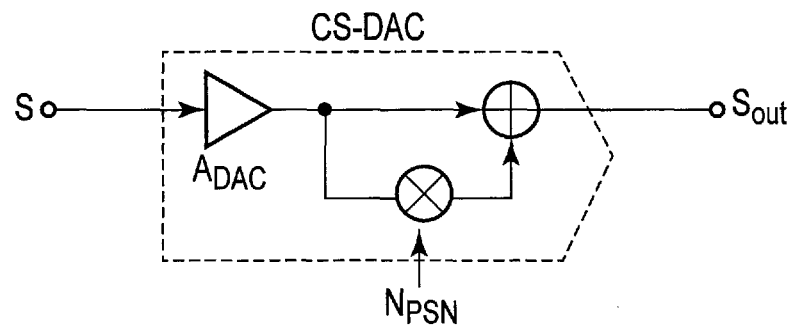
FIG. 3 is a diagram illustrating a model of a current steering DAC for which power supply noise is taken into account.

With the power supply noise taken into account, the current steering DAC can be modeled as depicted in FIG. 3. In FIG. 3, S denotes the digital input signal to the DAC, $S_{out}$ denotes the analog output signal from the DAC, $A_{DAC}$ denotes a conversion gain of the DAC, $N_{PSN}$ denotes the power supply noise. A transfer function for the model in FIG. 3 can be expressed by Equation (1).

$$S_{out} = A_{DAC} S (1+N_{PSN}) \quad (1)$$

According to Equation (1), an undesired wave component $A_{DAC} S N_{PSN}$ remains in the analog output signal $S_{out}$ resulting from mixture of the digital input signal S and the power supply noise $N_{PSN}$.

As described above, the DAC 404 receives the digital difference signal $(S_{in}-S_{in}N_1)$. Then, in Equation (1), substitution of $S=S_{in}-S_{in}N_1$ derives Equation (2).

$$\begin{aligned} S_{out} &= A_{DAC}(S_{in} - S_{in}N_1)(1 + N_{PSN}) \\ &= A_{DAC}(S_{in} - S_{in}N_1 + S_{in}N_{PSN} - S_{in}N_1 N_{PSN}) \end{aligned} \quad (2)$$

When the frequency component $f_1$, phase component $\phi_1$, and amplitude component $A_1$ of the sine wave signal $N_1$ match a frequency component $f_{PSN}$, a phase component $\phi_{PSN}$, and an amplitude component $A_{PSN}$, respectively, of the power supply noise $N_{PSN}$, $N_1=N_{PSN}$ holds true. Hence Equation (2) can be rewritten into Equation (3).

$$\begin{aligned} S_{out} &= A_{DAC}(S_{in} - S_{in}N_1 + S_{in}N_{PSN} - S_{in}N_1 N_{PSN}) \\ &= A_{DAC}(S_{in} - S_{in}N_1^2) \end{aligned} \quad (3)$$

Moreover, given $S_{in} \gg N_1$, the analog output signal $S_{out}$ can be approximated as illustrated in Equation (4).

$$S_{out} \approx A_{DAC} S_{in} \quad (4)$$

Equation (4) indicates that the power supply noise $N_{PSN}$ has been cancelled from the analog output signal $S_{out}$.

As described above, the power supply noise cancelling circuit according to the first embodiment generates the sine wave signal that simulates the power supply noise in the frequency component, amplitude component and phase component of the signal. The power supply noise cancelling circuit inputs, to the DAC, the digital difference signal resulting from subtraction of the digital product signal of the sine wave signal and the digital input signal from the digital input signal. Hence, the power supply noise cancelling circuit effectively cancels the power supply noise through signal processing performed by the DAC. Thus, the DAC can generate the analog output signal corresponding to the result of the digital-to-analog conversion of the desired wave component contained in the digital input signal. Moreover, the power supply noise cancelling circuit can cancel power supply noise with a frequency component ranging up to the Nyquist frequency of the DAC.

Second Embodiment

The power supply noise cancelling circuit in FIG. 1 can effectively cancel the power supply noise through the processing performed by the DAC 404 when the frequency component $f_1$, phase component $\phi_1$, and amplitude component $A_1$ of the sine wave signal $N_1$ generated by the sine wave generator 401 match the frequency component $f_{PSN}$, phase component $\phi_{PSN}$, and amplitude component $A_{PSN}$, respectively, of the power supply noise $N_{PSN}$. However, when the phase component $\phi_{PSN}$ of the power supply noise $N_{PSN}$ is unknown, it is difficult to appropriately pre-design the phase component $\phi_1$ of the sine wave signal $N_1$ generated by the sine wave generator 401. On the other hand, a power supply noise cancelling circuit according to a second embodiment can adjust the phase component of the sine wave signal as needed even after design of the sine wave signal.

As depicted in FIG. 5, the power supply noise cancelling circuit according to the second embodiment includes a sine wave generator 501, a phase shifter 502, a multiplier 503, a subtractor 504, and a DAC 505.

The sine wave generator 501 generates a sine wave signal $N_1$ that simulates power supply noise provided to the DAC 505 by a digital circuit (not depicted in the drawings), in a frequency component and a amplitude component of the signal. As described below, a power supply noise component can be effectively canceled through signal processing performed by the DAC 505 by appropriately designing the frequency component $f_1$ and amplitude component $A_1$ of the sine wave signal $N_1$ and using the phase shifter 502 to appropriately adjust the phase component $\phi_1$ of the sine wave signal $N_1$. The sine wave generator 501 outputs the sine wave signal $N_1$ to the phase shifter 502.

The phase shifter 502 receives the sine wave signal $N_1$ from the sine wave generator 501. The phase shifter 502 shifts the phase component $\phi_1$ of the sine wave signal $N_1$ by a predetermined amount to obtain a sine wave signal $N_1'$ with a phase component $\phi_1'$. A phase shift amount used by the phase shifter 502 may be manually or automatically calibrated, for example, by allowing the power supply noise cancelling circuit in FIG. 5 to perform a test operation before a normal operation, so as to maximize the effective resolution of the DAC 505 at the time of the test operation. The phase shifter 502 outputs the sine wave signal $N_1'$ to the multiplier 503.

The multiplier 503 receives the digital input signal $S_{in}$ and also receives the sine wave signal $N_1'$ from the phase shifter 502. The multiplier 503 multiplies the digital input signal $S_{in}$ by the sine wave signal $N_1'$ to obtain a digital product signal $S_{in}N_1'$. The multiplier 503 outputs the digital product signal $S_{in}N_1'$ to the subtractor 504.

The subtractor 504 receives the digital input signal $S_{in}$ and also receives the digital product signal $S_{in}N_1'$ from the multiplier 503. The subtractor 504 subtracts the digital product signal $S_{in}N_1'$ from the digital input signal $S_{in}$ to obtain a digital difference signal $(S_{in}-S_{in}N_1')$. The subtractor 504 outputs the digital difference signal $(S_{in}-S_{in}N_1')$ to the DAC 505.

The DAC 505 receives the digital difference signal $(S_{in}-S_{in}N_1')$ from the subtractor 504. The DAC 505 performs a digital-to-analog conversion on the digital difference signal $(S_{in}-S_{in}N_1')$ to obtain an analog output signal $S_{out}$. It is assumed that the frequency component $f_1$, phase component $\phi_1'$, and amplitude component $A_1$ of the sine wave signal $N_1'$ match the frequency component $f_{PSN}$, phase component $\phi_{PSN}$, and amplitude component $A_{PSN}$, respectively, of the power supply noise $N_{PSN}$. In this case, the analog output signal $S_{out}$ corresponds to a desired wave component resulting from removal of an undesired wave component from the digital input signal $S_{in}$.

As described above, the power supply noise cancelling circuit according to the second embodiment uses the phase shifter to adjust the phase component of the sine wave signal that simulates the power supply noise in the frequency component and amplitude component of the signal, to match the phase component of the sine wave signal with the phase component of the power supply noise. Thus, even if power supply noise with an unknown phase component is generated, the power supply noise cancelling circuit can cancel the power supply noise.

Third Embodiment

The above-described power supply noise cancelling circuit in FIG. 1 can effectively cancel the power supply noise component through signal processing performed by the DAC 404 when the frequency component $f_1$, phase component $\phi_1$, and amplitude component $A_1$ of the sine wave signal $N_1$ generated by the sine wave generator 401 match the frequency component $f_{PSN}$, phase component $\phi_{PSN}$, and amplitude component $A_{PSN}$ of the power supply noise $N_{PSN}$. However, when the amplitude component $A_{PSN}$ of the power supply noise $N_{PSN}$ is unknown, it is difficult to appropriately pre-design the amplitude component $A_1$ of the sine wave signal $N_1$ generated by the sine wave generator 401. On the other hand, a power supply noise cancelling circuit according to a third embodiment can adjust the amplitude component of the sine wave signal as needed even after design of the sine wave signal.

As depicted in FIG. 6, the power supply noise cancelling circuit according to the third embodiment includes a sine wave generator 601, a multiplier 602, a digital variable gain amplifier 603, a subtractor 604, and a DAC 605.

The sine wave generator 601 generates a sine wave signal $N_1$ that simulates power supply noise provided to the DAC 605 by a digital circuit (not depicted in the drawings), in a frequency component and a phase component of the signal. As described below, a power supply noise component can be effectively canceled through signal processing performed by the DAC 605 by appropriately designing the frequency component $f_1$ and phase component $\phi_1$ of the sine wave signal $N_1$ and using the digital variable gain amplifier 603 to appropriately adjust the amplitude component $A_1$ of the sine wave signal $N_1$. The sine wave generator 601 outputs the sine wave signal $N_1$ to the multiplier 602.

The multiplier 602 receives the digital input signal $S_{in}$ and also receives the sine wave signal $N_1$ from the sine wave generator 601. The multiplier 602 multiplies the digital input signal $S_{in}$ by the sine wave signal $N_1$ to obtain a digital product signal $S_{in}N_1$. The multiplier 602 outputs the digital product signal $S_{in}N_1$ to the digital variable gain amplifier 603.

The digital variable gain amplifier 603 receives the digital product signal $S_{in}N_1$ from the multiplier 602. The digital variable gain amplifier 603 amplifies or attenuates the digital product signal $S_{in}N_1$ with a predetermined variable gain to obtain a digital amplified signal $S_{in}N_1'$. The sine wave signal $N_1'$ has an amplitude component $A_1'$. A gain used by the digital variable gain amplifier 603 may be manually or automatically calibrated, for example, by allowing the power supply noise cancelling circuit in FIG. 6 to perform a test operation before a normal operation, so as to maximize the effective resolution of the DAC 605 at the time of the test operation. The digital variable gain amplifier 603 outputs the digital amplified signal $S_{in}N_1'$ to the subtractor 604.

The subtractor 604 receives the digital input signal $S_{in}$ and also receives the digital amplified signal $S_{in}N_1'$ from the digital variable gain amplifier 603. The subtractor 604 subtracts the digital amplified signal $S_{in}N_1'$ from the digital input signal $S_{in}$ to obtain a digital difference signal $(S_{in}-S_{in}N_1')$. The subtractor 604 outputs the digital difference signal $(S_{in}-S_{in}N_1')$ to the DAC 605.

The DAC 605 receives the digital difference signal $(S_{in}-S_{in}N_1')$ from the subtractor 604. The DAC 605 performs a digital-to-analog conversion on the digital difference signal $(S_{in}-S_{in}N_1')$ to obtain an analog output signal $S_{out}$. It is assumed that the frequency component $f_1$, phase component $\phi_1'$, and amplitude component $A_1'$ of the sine wave signal $N_1'$ match the frequency component $f_{PSN}$, phase component $\phi_{PSN}$, and amplitude component $A_{PSN}$, respectively, of the power supply noise $N_{PSN}$. In this case, the analog output signal $S_{out}$ corresponds to a desired wave component resulting from removal of an undesired wave component from the digital input signal $S_{in}$.

As described above, the power supply noise cancelling circuit according to the second embodiment uses the digital variable gain amplifier to adjust the amplitude component of the sine wave signal that simulates the power supply noise in the frequency component and phase component of the signal, to match the amplitude component of the sine wave signal with the amplitude component of the power supply noise. Thus, even if power supply noise with an unknown amplitude component is generated, the power supply noise cancelling circuit can cancel the power supply noise.

Fourth Embodiment

The above-described power supply noise cancelling circuit in FIG. 6 fails to automatically adjust amplitude component $A_1$ of the sine wave signal $N_1$ during a normal operation of the power supply noise cancelling circuit. On the other hand, a power supply noise cancelling circuit according to a fourth embodiment can automatically adjust the amplitude component of the sine wave signal during a normal operation of the power supply noise cancelling circuit.

As depicted in FIG. 7, the power supply noise cancelling circuit according to the fourth embodiment includes a sine wave generator 701, a phase shifter 702, a multiplier 703, a digital variable gain amplifier 704, a subtractor 705, a DAC 706, an ADC 707, a multiplier 708, and an integrator 709.

The sine wave generator 701 generates a sine wave signal $N_1$ that simulates power supply noise provided to the DAC 706 by a digital circuit (not depicted in the drawings), in a frequency component of the signal. As described below, a power supply noise component can be effectively canceled through signal processing performed by the DAC 706 by appropriately designing the frequency component $f_1$ of the sine wave signal $N_1$, using the phase shifter 702 to appropriately adjust the phase component $\phi_1$ of the sine wave signal $N_1$, and using the digital variable gain amplifier 704 to appropriately adjust the amplitude component $A_1$ of the sine wave signal $N_1$. The sine wave generator 701 outputs the sine wave signal $N_1$ to the phase shifter 702.

The phase shifter 702 receives the sine wave signal $N_1$ from the sine wave generator 701. The phase shifter 702 shifts the phase component $\phi_1$ of the sine wave signal $N_1$ by a predetermined amount to obtain a sine wave signal $N_1'$ with a phase component $\phi_1'$. A phase shift amount used by the phase shifter 702 may be manually or automatically calibrated, for example, by allowing the power supply noise cancelling circuit in FIG. 7 to perform a test operation before a normal operation, so as to maximize the effective resolution of the DAC 706 at the time of the test operation. The phase shifter 502 outputs the sine wave signal $N_1'$ to the multiplier 703.

The multiplier 703 receives the digital input signal $S_{in}$ and also receives the sine wave signal $N_1'$ from the phase shifter 702. The multiplier 703 multiplies the digital input signal $S_{in}$ by the sine wave signal $N_1'$ to obtain a digital product signal $S_{in}N_1'$. The multiplier 703 outputs the digital product signal $S_{in}N_1'$ to the digital variable gain amplifier 704 and the multiplier 708.

The digital variable gain amplifier 704 receives the digital product signal $S_{in}N_1'$ from the multiplier 703. The digital variable gain amplifier 704 amplifies or attenuates the digital product signal $S_{in}N_1'$ with a predetermined variable gain to obtain a digital amplified signal $S_{in}N_1''$. The sine wave signal $N_1''$ has an amplitude component $A_1'$. A gain used by the digital variable gain amplifier 704 is subjected to negative feedback control by an integral signal from the integrator 709. The digital variable gain amplifier 704 outputs the digital amplified signal $S_{in}N_1''$ to the subtractor 705.

The subtractor 705 receives the digital input signal $S_{in}$ and also receives the digital amplified signal $S_{in}N_1''$ from the digital variable gain amplifier 704. The subtractor 705 subtracts the digital amplified signal $S_{in}N_1''$ from the digital input signal $S_{in}$ to obtain a digital difference signal $(S_{in}-S_{in}N_1'')$. The subtractor 705 outputs the digital difference signal $(S_{in}-S_{in}N_1'')$ to the DAC 706.

The DAC 706 receives the digital difference signal $(S_{in}-S_{in}N_1'')$ from the subtractor 705. The DAC 706 performs a digital-to-analog conversion on the digital difference signal $(S_{in}-S_{in}N_1'')$ to obtain an analog output signal $S_{out}$. The analog output signal $S_{out}$ is output to the outside of the power supply noise cancelling circuit in FIG. 7 and to the ADC 707. It is assumed that the frequency component $f_1$, phase component $\phi_1'$, and amplitude component $A_1'$ of the sine wave signal $N_1''$ match the frequency component $f_{PSN}$, phase component $\phi_{PSN}$, and amplitude component $A_{PSN}$, respectively, of the power supply noise $N_{PSN}$. In this case, the analog output signal $S_{out}$ corresponds to a desired wave component resulting from removal of an undesired wave component from the digital input signal $S_{in}$.

ADC 707 receives the analog output signal $S_{out}$ from the DAC 706. The ADC 707 performs an analog-to-digital conversion on the analog output signal $S_{out}$ to obtain a digital feedback signal. The ADC 707 outputs the digital feedback signal to the multiplier 708. The ADC 707 may be able to generate a digital feedback signal that allows negative feedback control to be performed on the gain of the digital variable gain amplifier 704. Specifically, the ADC 704 may be, for example, a 1.5-bit ADC that can output three values regardless of the resolution of the DAC 706.

The multiplier 708 receives the digital product signal $S_{in}N_1'$ from the multiplier 703 and also receives the digital feedback signal from the ADC 707. The multiplier 708 multiplies the digital feedback signal by the digital product signal $S_{in}N_1'$ to obtain a digital product signal. A DC (Direct Current) component of the resultant digital product signal represents the correlation between the result of an analog-to-digital conversion of an undesired wave component remaining in the analog output signal $S_{out}$ and the digital product signal $S_{in}N_1'$. The multiplier 708 outputs the digital product signal to the integrator 709.

The integrator 709 receives the digital product signal from the multiplier 708. The integrator 709 performs integration on the digital product signal to obtain an integral signal. The integrator 709 outputs the integral signal to the digital variable gain amplifier 704. Convergence of the amplitude of the integral signal to a constant value is equivalent to the convergence of the undesired wave component remaining in the analog output signal to zero.

As described above, the power supply noise cancelling circuit according to the fourth embodiment uses the digital variable gain amplifier to adjust the amplitude component of the sine wave signal that simulates the power supply noise in the frequency component of the signal. Moreover, the gain of the digital variable gain amplifier is subjected to negative feedback control based on the correlation between the result of the analog-to-digital conversion of the undesired wave component remaining in the digital output signal and the result of mixture of the sine wave signal and the digital input signal. Thus, even if power supply noise with an unknown amplitude component is generated, the power supply noise cancelling circuit can automatically adjust the amplitude component of the sine wave signal to cancel the power supply noise.

The ADC provided to perform negative feedback control on the gain of the digital variable gain amplifier only needs a resolution of at most 3 bits. Hence, the digital variable gain amplifier can more accurately cancel the power supply noise while suppressing an increase in circuit area and power consumption.

Fifth Embodiment

The above-described power supply noise cancelling circuit in FIG. 7 adjusts the phase component $\phi_1$ of the sine wave signal $N_1$ using the phase shifter 702. On the other hand, a power supply noise cancelling circuit according to a fifth embodiment generates a cosine wave signal based on a sine wave signal, independently adjusts each of the amplitude components of the sine wave signal and the cosine wave signal, and synthesizes the sine wave signal and cosine wave signal with the amplitudes thereof adjusted to obtain a sine wave signal with a desired phase component.

As depicted in FIG. 8, the power supply noise cancelling circuit according to the fifth embodiment includes a sine wave generator 801, a multiplier 802, a digital amplifier 803, a phase shifter 804, a multiplier 805, a digital amplifier 806, an adder 807, a digital variable gain amplifier 808, a subtractor 809, a DAC 810, an ADC 811, a multiplier 812, and an integrator 813.

The sine wave generator 801 generates a sine wave signal $N_1$ that simulates power supply noise provided to the DAC 810 by a digital circuit (not depicted in the drawings), in a frequency component of the signal. As described below, a power supply noise component can be effectively canceled through signal processing performed by the DAC 810 by appropriately designing a frequency component $f_1$ of the sine wave signal $N_1$, using the digital amplifier 803 and the digital amplifier 806 to appropriately adjust the phase component $\phi_1$ of the sine wave component $N_1$, and using the digital variable gain amplifier 808 to appropriately adjust the amplitude component $A_1$ of the sine wave signal $N_1$. The sine wave generator 801 outputs the sine wave signal $N_1$ to the multiplier 802 and the phase shifter 804.

The multiplier 802 receives a digital input signal $S_{in}$ and also receives the sine wave signal $N_1$ from the sine wave generator 801. The multiplier 802 multiplies the digital input signal $S_{in}$ by the sine wave signal $N_1$ to obtain a digital product signal $S_{in}N_1$. The multiplier 802 outputs the digital product signal $S_{in}N_1$ to the digital amplifier 803.

The digital amplifier 803 receives the digital product signal $S_{in}N_1$ from the multiplier 802. The digital amplifier 803 amplifies or attenuates the digital product signal $S_{in}N_1$ with a predetermined gain to obtain a digital amplified signal $S_{in}N_1'$. The sine wave signal $N_1'$ has an amplitude component $A_1$. A gain used by the digital amplifier 803 depends on a phase component $\phi_1'$ described below. The digital amplifier 803 outputs the digital amplified signal $S_{in}N_1'$ to the adder 807.

The phase shifter 804 receives the sine wave signal $N_1$ from the sine wave generator 801. The phase shifter 804 shifts a phase component $\phi_1$ of the sine wave signal $N_1$ by $\pi/2$ [rad] to obtain a cosine wave signal $N_{1C}$ that corresponds to the sine wave signal $N_1$ (that is, which is equal to the sine wave signal $N_1$ in the frequency component, phase component, and amplitude component thereof). The phase shifter 804 outputs the cosine wave signal $N_{1C}$ to the multiplier 805.

The multiplier 805 receives the digital input signal $S_{in}$ and also receives the cosine wave signal $N_{1C}$ from the phase shifter 804. The multiplier 805 multiplies the digital input signal $S_{in}$ by the cosine wave signal $N_{1C}$ to obtain a digital product signal $S_{in}N_{1C}$. The multiplier 805 outputs the digital product signal $S_{in}N_{1C}$ to the digital amplifier 806.

The digital amplifier 806 receives the digital product signal $S_{in}N_{1C}$ from the multiplier 805. The digital amplifier 806 amplifies or attenuates the digital product signal $S_{in}N_{1C}$ with a predetermined gain to obtain a digital amplified signal $S_{in}N_{1C}'$. The cosine wave signal $N_{1C}'$ has an amplitude component $A_{1C}$. A gain used by the digital amplifier 806 depends on the phase component $\phi_1'$ described below. The digital amplifier 806 outputs the digital amplified signal $S_{in}N_{1C}'$ to the adder 807.

The adder 807 receives the digital amplified signal $S_{in}N_1'$ from the digital amplifier 803 and also receives the digital amplified signal $S_{in}N_{1C}'$ from the digital amplifier 806. The adder 807 adds the digital amplified signal $S_{in}N_1'$ and the digital amplified signal $S_{in}N_{1C}'$ together to obtain a digital summation signal $S_{in}N_1''$. The adder 807 outputs the digital summation signal $S_{in}N_1''$ to the digital variable gain amplifier 808 and the multiplier 812.

According to the addition theorem of the trigonometric function, Equation (5) holds true among digital amplified signal $S_{in}N_1'$, the digital amplified signal $S_{in}N_{1C}'$ and the digital summation signal $S_{in}N_1''$. In Equation (5), it is assumed that the initial phase of the sine wave signal $N_1$ is 0[rad] for simplification.

$$S_{in}N_1'' = S_{in}N_1' + S_{in}N_{1C}'$$

$$N_1'' = N_1' + N_{1C}$$

$$N_1'' = a_1 \sin(2\pi f_1 t) + a_{1C} \cos(2\pi f_1 t)$$

$$N_1'' = \sqrt{a_1^2 + a_{1C}^2} \sin(2\pi f_1 t + \alpha_1)$$

$$N_1'' = A_1' \sin \phi_1' \quad (5)$$

The initial phase $\alpha_1$ of the sine wave signal $N_1''$ satisfies both Equation (6) and Equation (7).

$$\alpha_1 \arcsin\left(\frac{a_1 C}{\sqrt{a_1^2 + a_{1C}^2}}\right) \quad (6)$$

$$\alpha_1 \arccos\left(\frac{a_1}{\sqrt{a_1^2 + a_{1C}^2}}\right) \quad (7)$$

Thus, the phase component $\phi_1'$ of the sine wave signal $N_1''$ can be set to any desired value by appropriately controlling the gains of the digital amplifier 803 and the digital amplifier 806. The desired value of the phase component $\phi_1'$ of the sine wave signal $N_1''$ may be manually or automatically calibrated, for example, by allowing the power supply noise cancelling circuit in FIG. 8 to perform a test operation before a normal operation, so as to maximize the effective resolution of the DAC 810 at the time of the test operation.

The digital variable gain amplifier 808 receives the digital summation signal $S_{in}N_1''$ from the adder 807. The digital variable gain amplifier 808 amplifies or attenuates the digital summation signal $S_{in}N_1''$ with a predetermined variable gain to obtain a digital amplified signal $S_{in}N_1'''$. The sine wave signal $N_1''$ has an amplitude component $A_1''$. A gain used by the digital variable gain amplifier 808 is subjected to negative feedback control by an integral signal from the integrator 813. The digital variable gain amplifier 808 outputs the digital amplified signal $S_{in}N_1'''$ to the subtractor 809.

The subtractor 809 receives the digital input signal $S_{in}$ and also receives the digital amplified signal $S_{in}N_1'''$ from the digital variable gain amplifier 808. The subtractor 809 subtracts the digital amplified signal $S_{in}N_1''$ from the digital input signal $S_{in}$ to obtain a digital difference signal $(S_{in}-S_{in}N_1'')$. The subtractor 809 outputs the digital difference signal $(S_{in}-S_{in}N_1''')$ to the DAC 810.

The DAC 810 receives the digital difference signal $(S_{in}-S_{in}N_1'')$ from the subtractor 809. The DAC 810 performs a digital-to-analog conversion on the digital difference signal $(S_{in}-S_{in}N_1'')$ to obtain an analog output signal $S_{out}$. The analog output signal $S_{out}$ is output to the outside of the power supply noise cancelling circuit in FIG. 8 and to the ADC 811. It is assumed that the frequency component $f_1$, phase component $\phi_1'$, and amplitude component $A_1''$ of the sine wave signal $N_1''$ match the frequency component $f_{PSN}$, phase component $\phi_{PSN}$, and amplitude component $A_{PSN}$, respectively, of the power supply noise $N_{PSN}$. In this case, the analog output signal $S_{out}$ corresponds to a desired wave component resulting from removal of an undesired wave component from the digital input signal $S_{in}$.

ADC 811 receives the analog output signal $S_{out}$ from the DAC 810. The ADC 811 performs an analog-to-digital conversion on the analog output signal $S_{out}$ to obtain a digital feedback signal. The ADC 811 outputs the digital feedback signal to the multiplier 812. The ADC 811 may be able to generate a digital feedback signal that allows negative feedback control to be performed on the gain of the digital variable gain amplifier 808. Specifically, the ADC 811 may be, for example, a 1.5-bit ADC that can output three values regardless of the resolution of the DAC 810.

The multiplier 812 receives the digital summation signal $S_{in}N_1''$ from the adder 807 and also receives the digital feedback signal from the ADC 811. The multiplier 812 multiplies the digital feedback signal by the digital summation signal $S_{in}N_1''$ to obtain a digital product signal. A DC component of the digital product signal represents the correlation between the result of an analog-to-digital conversion of an undesired wave component remaining in the analog output signal $S_{out}$ and the digital summation signal $S_{in}N_1''$. The multiplier 812 outputs the digital product signal to the integrator 813.

The integrator 813 receives the digital product signal from the multiplier 812. The integrator 813 performs integration on the digital product signal to generate an integral signal. The integrator 813 outputs the integral signal to the digital variable gain amplifier 808. Convergence of the amplitude of the integral signal to a constant value is equivalent to the convergence of the undesired wave component remaining in the analog output signal to zero.

As described above, the power supply noise cancelling circuit according to the fifth embodiment, like the power supply noise cancelling, circuit according to the fourth embodiment, automatically adjusts the amplitude of the sine wave signal that simulates the power supply noise in the frequency component of the signal. Moreover, the power supply noise cancelling circuit according to the fifth embodiment generates a cosine wave signal based on the sine wave signal, independently adjusts each of the amplitude components of the sine wave signal and the cosine wave signal, and synthesizes the sine wave signal and cosine wave signal with the amplitudes thereof adjusted to obtain a sine wave signal with a desired phase component. Thus, even if power supply noise with an unknown phase component is generated, the power supply noise cancelling circuit can cancel the power supply noise.

Sixth Embodiment

The above-described power supply noise cancelling circuit in FIG. 8 fails to automatically adjust the phase component $\phi_1$ of the sine wave signal $N_1$ during a normal operation of the power supply noise cancelling circuit. On the other hand, a power supply noise cancelling circuit according to a sixth embodiment can automatically adjust the phase component and amplitude component of the sine wave signal during a normal operation of the power supply noise cancelling circuit.

Figure 9:
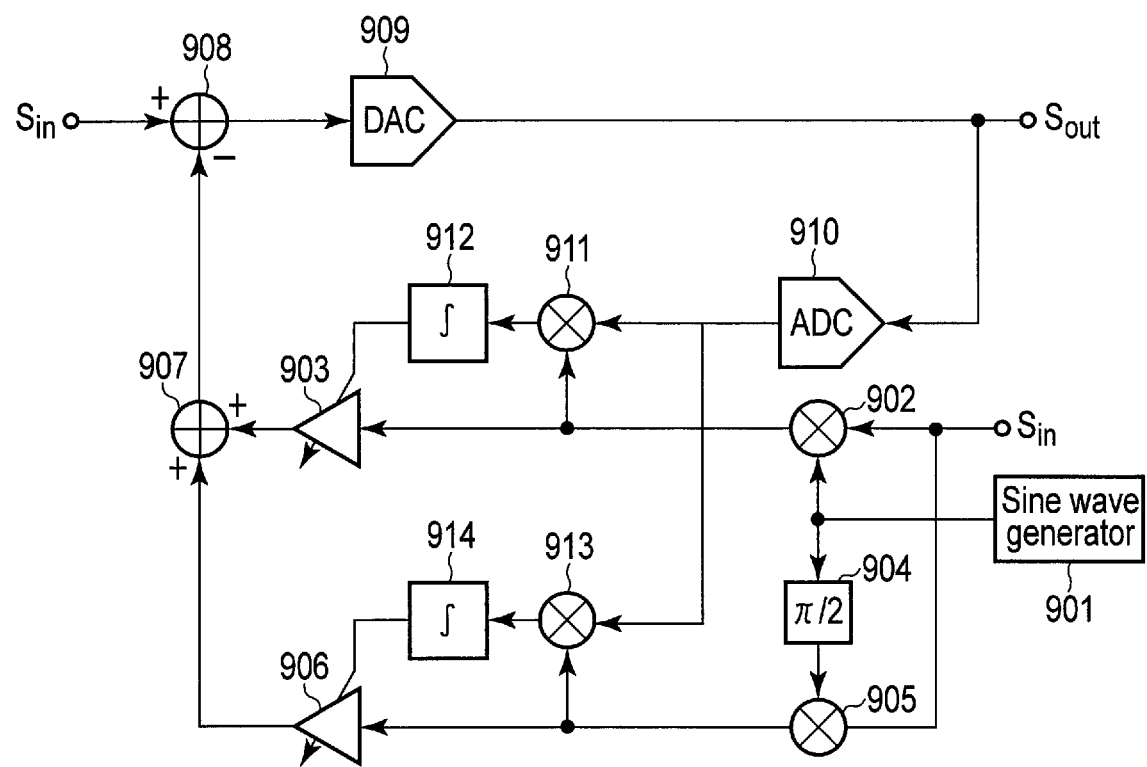
FIG. 9 is a diagram illustrating a power supply noise cancelling circuit according to a sixth embodiment.

As depicted in FIG. 9, the power supply noise cancelling circuit according to the sixth embodiment includes a sine wave generator 901, a multiplier 902, a digital variable gain amplifier 903, a phase shifter 904, a multiplier 905, a digital variable gain amplifier 906, an adder 907, a subtractor 908, a DAC 909, an ADC 910, a multiplier 911, an integrator 912, a multiplier 913, and an integrator 914.

The sine wave generator 901 generates a sine wave signal $N_1$ that simulates power supply noise provided to the DAC 909 by a digital circuit (not depicted in the drawings), in a frequency component of the signal. As described below, a power supply noise component can be effectively canceled through signal processing performed by the DAC 909 by appropriately designing a frequency component $f_1$ of the sine wave signal $N_1$ and using the digital variable gain amplifier 903 and the digital variable gain amplifier 906 to appropriately adjust the amplitude component $A_1$ and phase component $\phi_1$ of the sine wave signal $N_1$. The sine wave generator 901 outputs the sine wave signal $N_1$ to the multiplier 902 and the phase shifter 904.

The multiplier 902 receives a digital input signal $S_{in}$ and also receives the sine wave signal $N_1$ from the sine wave generator 901. The multiplier 902 multiplies the digital input signal $S_{in}$ by the sine wave signal $N_1$ to obtain a digital product signal $S_{in}N_1$. The multiplier 902 outputs the digital product signal $S_{in}N_1$ to the digital variable gain amplifier 903 and multiplier 911.

The digital variable gain amplifier 903 receives the digital summation signal $S_{in}N_1$ from the multiplier 902. The digital variable gain amplifier 903 amplifies or attenuates the digital product signal $S_{in}N_1$ at a predetermined variable gain to obtain a digital amplified signal $S_{in}N_1'$. The sine wave signal $N_1'$ has an amplitude component $A_1$. A gain used by the digital variable gain amplifier 903 is subjected to negative feedback control by an integral signal from the integrator 912. The digital variable gain amplifier 903 outputs the digital amplified signal $S_{in}N_1'$ to the adder 907.

The phase shifter 904 receives the sine wave signal $N_1$ from the sine wave generator 901. The phase shifter 904 shifts the phase component $\phi_1$ of the sine wave signal $N_1$ by $\pi/2$ [rad] to obtain a cosine wave signal $N_{1C}$ that corresponds to the sine wave signal $N_1$. The phase shifter 904 outputs the cosine wave signal $N_{1C}$ to the multiplier 905.

The multiplier 905 receives the digital input signal $S_{in}$ and also receives the cosine wave signal $N_{1C}$ from the phase shifter 904. The multiplier 905 multiplies the digital input signal $S_{in}$ by the cosine wave signal $N_{1C}$ to obtain a digital product signal $S_{in}N_{1C}$. The multiplier 905 outputs the digital product signal $S_{in}N_{1C}$ to the digital variable gain amplifier 906 and the multiplier 913.

The digital variable gain amplifier 906 receives the digital summation signal $S_{in}N_{1C}$ from the multiplier 905. The digital variable gain amplifier 906 amplifies or attenuates the digital product signal $S_{in}N_{1C}$ with a predetermined variable gain to obtain a digital amplified signal $S_{in}N_{1C}'$. The cosine wave signal $N_{1C}'$ has an amplitude component $A_{1C}$. A gain used by the digital variable gain amplifier 906 is subjected to negative feedback control by an integral signal from the integrator 914. The digital variable gain amplifier 906 outputs the digital amplified signal $S_{in}N_{1C}'$ to the adder 907.

The adder 907 receives the digital amplified signal $S_{in}N_1'$ from the digital variable gain amplifier 903 and also receives the digital amplified signal $S_{in}N_{1C}'$ from the digital variable gain amplifier 906. The adder 907 adds the digital amplified signal $S_{in}N_1'$ and the digital amplified signal $S_{in}N_{1C}'$ together to obtain a digital summation signal $S_{in}N_1''$. The adder 907 outputs the digital summation signal $S_{in}N_1''$ to the subtractor 908.

The subtractor 908 receives the digital input signal $S_{in}$ and also receives the digital summation signal $S_{in}N_1''$ from the adder 907. The subtractor 908 subtracts the digital summation signal $S_{in}N_1''$ from the digital input signal $S_{in}$ to obtain a digital difference signal $(S_{in}-S_{in}N_1'')$. The subtractor 908 outputs the digital difference signal $(S_{in}-S_{in}N_1'')$ to the DAC 909.

The DAC 909 receives the digital difference signal $(S_{in}-S_{in}N_1'')$ from the subtractor 908. The DAC 909 performs a digital-to-analog conversion on the digital difference signal $(S_{in}-S_{in}N_1'')$ to obtain an analog output signal $S_{out}$. The analog output signal $S_{out}$ is output to the outside of the power supply noise cancelling circuit in FIG. 9 and to the ADC 910. It is assumed that the frequency component $f_1$, phase component $\phi_1'$, and amplitude component $A_1'$ of the sine wave signal $N_1''$ match a frequency component $f_{PSN}$, a phase component $\phi_{PSN}$, and an amplitude component $A_{PSN}$, respectively, of a power supply noise $N_{PSN}$. In this case, the analog output signal $S_{out}$ corresponds to a desired wave component resulting from removal of an undesired wave component from the digital input signal $S_{in}$.

ADC 910 receives the analog output signal $S_{out}$ from the DAC 909. The ADC 910 performs an analog-to-digital conversion on the analog output signal $S_{out}$ to obtain a digital feedback signal. The ADC 910 outputs the digital feedback signal to the multiplier 911 and the multiplier 913. The ADC 910 may be able to generate a digital feedback signal that allows negative feedback control to be performed on the gain of the digital variable gain amplifier 903 and the gain of the digital variable gain amplifier 906. Specifically, the ADC 910 may be, for example, a 1.5-bit ADC that can output three values regardless of the resolution of the DAC 909.

The multiplier 911 receives the digital summation signal $S_{in}N_1$ from the multiplier 902 and also receives the digital feedback signal from the ADC 910. The multiplier 911 multiplies the digital feedback signal by the digital product signal $S_{in}N_1$ to obtain a digital product signal. A DC component of the resultant digital product signal represents the correlation between the result of an analog-to-digital conversion of an undesired wave component remaining in the analog output signal $S_{out}$ and the digital product signal $S_{in}N_1$. The multiplier 911 outputs the digital product signal to the integrator 912.

The integrator 912 receives the digital product signal from the multiplier 911. The integrator 912 performs integration on the digital product signal to generate an integral signal. The integrator 912 outputs the integral signal to the digital variable gain amplifier 903. Convergence of the amplitudes of both the integral signal and an integral signal generated by the integrator 914 described below to constant values is equivalent to the convergence of the undesired wave component remaining in the analog output signal to zero.

The multiplier 913 receives the digital product signal $S_{in}N_{1C}$ from the multiplier 905 and also receives the digital feedback signal from the ADC 910. The multiplier 913 multiplies the digital feedback signal by the digital product signal $S_{in}N_{1C}$ to obtain a digital product signal. A DC component of the resultant digital product signal represents the correlation between the result of an analog-to-digital conversion of an undesired wave component remaining in the analog output signal $S_{out}$ and the digital product signal $S_{in}N_{1C}$. The multiplier 913 outputs the digital product signal to the integrator 914.

The integrator 914 receives the digital product signal from the multiplier 913. The integrator 914 performs integration on the digital product signal to generate an integral signal. The integrator 914 outputs the integral signal to the digital variable gain amplifier 906. Convergence of the amplitudes of both the integral signal and the above-described integral signal generated by the integrator 912 to constant values is equivalent to the convergence of the undesired wave component remaining in the analog output signal to zero.

As described above, the power supply noise cancelling circuit according to the sixth embodiment generates the cosine wave signal based on the sine wave signal that simulates the power supply noise in the frequency component of the signal, uses the two digital variable gain amplifiers to independently adjust the respective amplitudes of the sine wave signal and the cosine wave signal, and synthesizes the sine wave signal and cosine wave signal with the amplitudes thereof adjusted to obtain the sine wave signal with the desired amplitude component and phase component. Moreover, the gains of the digital variable gain amplifiers are each subjected to negative feedback control based on the correlation between the result of the analog-to-digital conversion of the undesired wave component remaining in the digital output signal and the result of mixture of the sine wave signal and the digital input signal and between the result of the analog-to-digital conversion and the result of mixture of the cosine wave signal and the digital input signal. Thus, even if power supply noise with an unknown amplitude component and an unknown phase component is generated, the power supply noise cancelling circuit can automatically adjust the amplitude component and phase component of the sine wave signal to cancel the power supply noise.

Seventh Embodiment

The above-described power supply noise cancelling circuit in FIGS. 4 to 9 models power supply noise as a sine wave signal with a single frequency component and appropriately adjusts the amplitude component and phase component of the sine wave signal to effectively cancel the power supply noise. However, the power supply noise may desirably be modeled as a synchronized wave signal corresponding to a superimposition of a plurality of sine wave signals with different frequency components instead of the sine wave signal with the single frequency component. For example, power supply noise propagating to a DAC may involve a high spurious level not only in a frequency component equal to the operating frequency of a digital circuit connected to the DAC but also in a frequency component equal to double the operating frequency. A power supply noise cancelling circuit according to a seventh embodiment models power supply noise as a synthesized wave signal of a plurality of sine wave signals with different frequency components and appropriately adjusts the amplitude component and phase component of each of the plurality of sine wave signals to effectively cancel the power supply noise.

As depicted in FIG. 10, the power supply noise cancelling circuit according to the seventh embodiment includes a sine wave generator 1001, a phase shifter 1002, a multiplier 1003, a digital variable gain amplifier 1004, a sine wave generator 1005, a phase shifter 1006, a multiplier 1007, a digital variable gain amplifier 1008, an adder 1009, a subtractor 1010, a DAC 1011, an ADC 1012, a multiplier 1013, an integrator 1014, a multiplier 1015, and an integrator 1016.

The sine wave generator 1001 generates a sine wave signal $N_1$ that simulates a first power supply noise component contained in power supply noise provided to the DAC 1011 by a digital circuit (not depicted in the drawings), in a frequency component of the signal. As described below, the first power supply noise component can be effectively canceled through signal processing performed by the DAC 1011 by appropriately designing a frequency component $f_1$ of the sine wave signal $N_1$, using the phase shifter 1002 to appropriately adjust a phase component $\phi_1$ of the sine wave signal $N_1$, and using the digital variable gain amplifier 1004 to appropriately adjust an amplitude component $A_1$ of the sine wave signal $N_1$. The sine wave generator 1001 outputs the sine wave signal $N_1$ to the phase shifter 1002.

The phase shifter 1002 receives the sine wave signal $N_1$ from the sine wave generator 1001. The phase shifter 1002 shifts the phase component $\phi_1$ of the sine wave signal $N_1$ by a predetermined amount to obtain a sine wave signal $N_1'$ with a phase component $\phi_1'$. A phase shift amount used by the phase shifter 1002 may be manually or automatically calibrated, for example, by allowing the power supply noise cancelling circuit in FIG. 10 to perform a test operation before a normal operation, so as to maximize the effective resolution of the DAC 1011 at the time of the test operation. The phase shifter 1002 outputs the sine wave signal $N_1'$ to the multiplier 1003.

The multiplier 1003 receives a digital input signal $S_{in}$ and also receives the sine wave signal $N_1'$ from the phase shifter 1002. The multiplier 1003 multiplies the digital input signal $S_{in}$ by the sine wave signal $N_1'$ to obtain a digital product signal $S_{in}N_1'$. The multiplier 1003 outputs the digital product signal $S_{in}N_1'$ to the digital variable gain amplifier 1004 and the multiplier 1013.

The digital variable gain amplifier 1004 receives the digital product signal $S_{in}N_1'$ from the multiplier 1003. The digital variable gain amplifier 1004 amplifies or attenuates the digital product signal $S_{in}N_1'$ with a predetermined variable gain to obtain a digital amplified signal $S_{in}N_1''$. The sine wave signal $N_1''$ has an amplitude component $A_1'$. A gain used by the digital variable gain amplifier 1004 is subjected to negative feedback control by an integral signal from the integrator 1014. The digital variable gain amplifier 1004 outputs the digital amplified signal $S_{in}N_1''$ to the adder 1009.

The sine wave generator 1005 generates a sine wave signal $N_2$ that simulates a second power supply noise component contained in power supply noise provided to the DAC 1011 by a digital circuit (not depicted in the drawings), in a frequency component of the signal. As described below, the second power supply noise component can be effectively canceled through signal processing performed by the DAC 1011 by appropriately designing a frequency component $f_2$ of the sine wave signal $N_2$, using the phase shifter 1006 to appropriately adjust a phase component $\phi_2$ of the sine wave signal $N_2$, and using the digital variable gain amplifier 1008 to appropriately adjust an amplitude component $A_2$ of the sine wave signal $N_2$. The sine wave generator 1005 outputs the sine wave signal $N_2$ to the phase shifter 1006.

The phase shifter 1006 receives the sine wave signal $N_2$ from the sine wave generator 1005. The phase shifter 1006 shifts the phase component $\phi_2$ of the sine wave signal $N_2$ by a predetermined amount to obtain a sine wave signal $N_2'$ with a phase component $\phi_2'$. A phase shift amount used by the phase shifter 1006 may be manually or automatically calibrated, for example, by allowing the power supply noise cancelling circuit in FIG. 10 to perform a test operation before a normal operation, so as to maximize the effective resolution of the DAC 1011 at the time of the test operation. The phase shifter 1006 outputs the sine wave signal $N_2'$ to the multiplier 1007.

The multiplier 1007 receives the digital input signal $S_{in}$ and also receives the sine wave signal $N_2'$ from the phase shifter 1006. The multiplier 1007 multiplies the digital input signal $S_{in}$ by the sine wave signal $N_2'$ to obtain a digital product signal $S_{in}N_2'$. The multiplier 1007 outputs the digital product signal $S_{in}N_2'$ to the digital variable gain amplifier 1008 and the multiplier 1013.

The digital variable gain amplifier 1008 receives the digital product signal $S_{in}N_2'$ from the multiplier 1007. The digital variable gain amplifier 1008 amplifies or attenuates the digital product signal $S_{in}N_2'$ with a predetermined variable gain to obtain a digital amplified signal $S_{in}N_2''$. The sine wave signal $N_2''$ has an amplitude component $A_2'$. A gain used by the digital variable gain amplifier 1008 is subjected to negative feedback control by an integral signal from the integrator 1014. The digital variable gain amplifier 1008 outputs the digital amplified signal $S_{in}N_2''$ to the adder 1009.

The adder 1009 receives the digital amplified signal $S_{in}N_1''$ from the digital variable gain amplifier 1004 and also receives the digital amplified signal $S_{in}N_2''$ from the digital variable gain amplifier 1008. The adder 1009 adds the digital amplified signal $S_{in}N_1''$ and the digital amplified signal $S_{in}N_2''$ together to obtain a digital summation signal $(S_{in}N_1''+S_{in}N_2'')$. The adder 1009 outputs the digital summation signal $(S_{in}N_1''+S_{in}N_2'')$ to the subtractor 1010.

The subtractor 1010 receives the digital input signal $S_{in}$ and also receives the digital summation signal $(S_{in}N_1''+S_{in}N_2'')$ from the digital variable gain amplifier 1004. The subtractor 1010 subtracts the digital summation signal $(S_{in}N_1''+S_{in}N_2'')$ from the digital input signal $S_{in}$ to obtain a digital difference signal $(S_{in}-S_{in}N_1''-S_{in}N_2'')$. The subtractor 1010 outputs the digital difference signal $(S_{in}-S_{in}N_1''-S_{in}N_2'')$ to the DAC 1011.

The DAC 1011 receives the digital difference signal $(S_{in}-S_{in}N_1''-S_{in}N_2'')$ from the subtractor 1010. The DAC 1011 performs a digital-to-analog conversion on the digital difference signal $(S_{in}-S_{in}N_1''-S_{in}N_2'')$ to obtain an analog output signal $S_{out}$. The analog output signal $S_{out}$ is output to the outside of the power supply noise cancelling circuit in FIG. 10 and to the ADC 1012.

It is assumed that the frequency component $f_1$, phase component $\phi_1'$, and amplitude component $A_1'$ of the sine wave signal $N_1''$ match a frequency component $f_{PSN1}$, a phase component $\phi_{PSN1}$, and an amplitude component $A_{PSN1}$, respectively, of a first power supply noise component $N_{PSN1}$ contained in power supply noise $N_{PSN}$ and that the frequency component $f_2'$, phase component $\phi_2'$, and amplitude component $A_2'$ of the sine wave signal $N_2''$ match a frequency component $f_{PSN2}$, a phase component $\phi_{PSN2}$, and an amplitude component $A_{PSN2}$, respectively, of a second power supply noise component $N_{PSN2}$ contained in the power supply noise $N_{PSN}$. In this case, the analog output signal $S_{out}$ corresponds to a desired wave component resulting from removal of an undesired wave component (specifically, the first power supply noise component $N_{PSN1}$ and the second power supply noise component $N_{PSN2}$) from the digital input signal $S_{in}$. Here, given $N_{PSN}=N_{PSN1} N_{PSN2}$, Equation (8) holds true.

$$S_{out} = A_{DAC}(S_{in} - S_{in}N_1'' - S_{in}N_2'')(1 + N_{PSN1} + N_{PSN2}) \quad (8)$$
$$= A_{DAC}S_{in}\{1 - (N_1'' + N_2'')\}\{1 + (N_1'' + N_2'')\}$$
$$= A_{DAC}S_{in}\{1 - (N_1'' + N_2'')^2\}$$

Given $S_{in} \gg (N_1''+N_2'')$ in Equation (8), Equation (4) described above also holds true.

ADC 1012 receives the analog output signal $S_{out}$ from the DAC 1012. The ADC 1012 performs an analog-to-digital conversion on the analog output signal $S_{out}$ to obtain a digital feedback signal. The ADC 1012 outputs the digital feedback signal to the multiplier 1013 and the multiplier 1015. The ADC 1012 may be able to generate a digital feedback signal that allows negative feedback control to be performed on the gains of the digital variable gain amplifier 1004 and the digital variable gain amplifier 1008. Specifically, the ADC 1012 may be, for example, a 1.5-bit ADC that can output three values regardless of the resolution of the DAC 1011.

The multiplier 1013 receives the digital product signal $S_{in}N_1'$ from the multiplier 1003 and also receives the digital feedback signal from the ADC 1012. The multiplier 1013 multiplies the digital feedback signal by the digital product signal $S_{in}N_1'$ to obtain a digital product signal. A DC component of the resultant digital product signal represents the correlation between the result of an analog-to-digital conversion of the first power supply noise component $N_{PSN1}$ remaining in the analog output signal $S_{out}$ and the digital product signal $S_{in}N_1'$. The multiplier 1013 outputs the digital product signal to the integrator 1014.

The integrator 1014 receives the digital product signal from the multiplier 1013. The integrator 1014 performs integration on the digital product signal to generate an integral signal. The integrator 1014 outputs the integral signal to the digital variable gain amplifier 1004. Convergence of the amplitude of the integral signal to a constant value is equivalent to the convergence of the first power supply noise component $N_{PSN1}$ remaining in the analog output signal to zero.

The multiplier 1015 receives the digital product signal $S_{in}N_2'$ from the multiplier 1003 and also receives the digital feedback signal from the ADC 1012. The multiplier 1015 multiplies the digital feedback signal by the digital product signal $S_{in}N_2'$ to obtain a digital product signal. A DC component of the resultant digital product signal represents the correlation between the result of an analog-to-digital conversion of the second power supply noise component $N_{PSN2}$ remaining in the analog output signal $S_{out}$ and the digital product signal $S_{in}N_2'$. The multiplier 1015 outputs the digital product signal to the integrator 1016.

The integrator 1016 receives the digital product signal from the multiplier 1015. The integrator 1016 performs integration on the digital product signal to generate an integral signal. The integrator 1016 outputs the integral signal to the digital variable gain amplifier 1004. Convergence of the amplitudes of the integral signal to a constant value is equivalent to the convergence of the second power supply noise component $N_{PSN2}$ remaining in the analog output signal to zero.

As described above, the power supply noise cancelling circuit according to the seventh embodiment models the power supply noise as the synthesized wave signal of the plurality of sine wave signals with the different frequency components and appropriately adjusts the amplitude component and phase component of each of the plurality of sine wave signals to effectively cancel the power supply noise. Specifically, the plurality of digital variable gain amplifiers are used to adjust the amplitude components of the plurality of sine wave signals that simulate the plurality of power supply noise components contained in the power supply noise in the frequency components of the signals. Moreover, the gains of the digital variable gain amplifiers are each subjected to negative feedback control based on the correlation between the result of the analog-to-digital conversion of the plurality of power supply noise components remaining in the digital output signal and the plurality of sine wave signals. Thus, even if power supply noise with a plurality of power supply noise components including unknown amplitude components is generated, the power supply noise cancelling circuit can automatically adjust the amplitude components of the plurality of sine wave signals to cancel the power supply noise.

The power supply noise can be modeled as a synthesized wave signal of three or more sine wave signals with different frequency components. In this case, it is preferable to additionally install sine wave generators, phase shifters, multipliers, and variable gain amplifiers for processing the additional sine wave signals, and multipliers and integrators for performing negative feedback control on the gains of the variable gain amplifiers.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A power supply noise cancelling circuit, comprising:
a generator that generates a sine wave signal;
a first multiplier that multiplies a digital input signal by a digital signal based on the sine wave signal to generate a first digital product signal;
a subtractor that subtracts a digital signal based on the first digital product signal from the digital input signal to generate a digital difference signal; and
a digital-to-analog converter that performs a digital-to-analog conversion on the digital difference signal to obtain an analog output signal.
2. The circuit according to claim 1, further comprising a phase shifter that shifts a phase component of the sine wave signal by a predetermined amount to obtain a phase-adjusted sine wave signal, and wherein the first multiplier multiplies the digital input signal by the phase-adjusted sine wave signal to generate the first digital product signal.

3. The circuit according to claim 1, further comprising a first variable gain amplifier that amplifies or attenuates the first digital product signal with a first variable gain to obtain an amplitude-adjusted digital product signal, and wherein the subtractor subtracts the amplitude-adjusted digital product signal from the digital input signal to generate the digital difference signal.

4. The circuit according to claim 1, further comprising:
a phase shifter that shifts a phase component of the sine wave signal by a predetermined amount to obtain a phase-adjusted sine wave signal;
a first variable gain amplifier that amplifies or attenuates the first digital product signal with a first variable gain to obtain an amplitude-adjusted digital product signal;
an analog-to-digital converter that performs an analog-to-digital conversion on the analog output signal to obtain a digital feedback signal;
a second multiplier that multiplies the digital feedback signal by the first digital product signal to obtain a second digital product signal; and
a first integrator that performs integration on the second digital product signal to obtain a first integral signal, wherein:
the first multiplier multiplies the digital input signal by the phase-adjusted sine wave signal to generate the first digital product signal,
the subtractor subtracts the amplitude-adjusted digital product signal from the digital input signal to generate the digital difference signal, and
the first variable gain is controlled by the first integral signal.

5. The circuit according to claim 1, further comprising:
a first digital amplifier that amplifies or attenuates the first digital product signal with a predetermined gain to obtain a first digital amplified signal;
a phase shifter that shifts a phase component of the sine wave signal by $\pi/2$ to obtain a cosine wave signal;
a second multiplier that multiplies the digital input signal by the cosine wave signal to obtain a second digital product signal;
a second digital amplifier that amplifies or attenuates the second digital product signal with a predetermined gain to obtain a second digital amplified signal;
an adder that adds the first digital amplified signal and the second digital amplified signal together to obtain a phase-adjusted digital product signal;
a digital variable gain amplifier that amplifies or attenuates the phase-adjusted digital product signal with a first variable gain to obtain an amplitude-adjusted digital product signal;
an analog-to-digital converter that performs an analog-to-digital conversion on the analog output signal to obtain a digital feedback signal;
a third multiplier that multiplies the digital feedback signal by the amplitude-adjusted digital product signal to obtain a third digital product signal; and
a first integrator that performs integration on the third digital product signal to obtain a first integral signal, wherein:
the subtractor subtracts the amplitude-adjusted digital product signal from the digital input signal to generate the digital difference signal, and
the first variable gain is controlled by the first integral signal.

6. The circuit according to claim 1, further comprising:
a first digital amplifier that amplifies or attenuates the first digital product signal with a first variable gain to obtain a first digital amplified signal;
a phase shifter that shifts a phase component of the sine wave signal by $\pi/2$ to obtain a cosine wave signal;
a second multiplier that multiplies the digital input signal by the cosine wave signal to obtain a second digital product signal;
a second digital variable gain amplifier that amplifies or attenuates the second digital product signal with a second variable gain to obtain a second digital amplified signal;
an adder that adds the first digital amplified signal and the second digital amplified signal together to obtain an adjusted digital product signal;
an analog-to-digital converter that performs an analog-to-digital conversion on the analog output signal to obtain a digital feedback signal;
a third multiplier that multiplies the digital feedback signal by the first digital product signal to obtain a third digital product signal;
a first integrator that performs integration on the third digital product signal to obtain a first integral signal;
a fourth multiplier that multiplies the digital feedback signal by the second digital product signal to obtain a fourth digital product signal; and
a second integrator that performs integration on the fourth digital product signal to obtain a second integral signal, wherein:
the subtractor subtracts the adjusted digital product signal from the digital input signal to generate the digital difference signal,
the first variable gain is controlled by the first integral signal, and
the second variable gain is controlled by the second integral signal.

7. A power supply noise cancelling circuit, comprising:
a first generator that generates a first sine wave signal;
a first phase shifter that shifts a phase component of the first sine wave signal to obtain a first phase-adjusted sine wave signal;
a first multiplier that multiplies a digital input signal by the first phase-adjusted sine wave signal to generate a first digital product signal;
a first variable gain amplifier that amplifies or attenuates the first digital product signal with a first variable gain to obtain a first digital amplified signal;
a second generator that generates a second sine wave signal with a frequency component different from a frequency component of the first sine wave signal;
a second phase shifter that shifts a phase component of the second sine wave signal by a predetermined amount to obtain a second phase-adjusted sine wave signal;
a second multiplier that multiplies the digital input signal by the second phase-adjusted sine wave signal to generate a second digital product signal;
a second variable gain amplifier that amplifies or attenuates the second digital product signal with a second variable gain to obtain a second digital amplified signal;
an adder that adds the first digital amplified signal and the second digital amplified signal together to obtain a digital summation signal;
a subtractor that subtracts the digital summation signal from the digital input signal to generate a digital difference signal;

a digital-to-analog converter that performs a digital-to-analog conversion on the digital difference signal to obtain an analog output signal;

an analog-to-digital converter that performs an analog-to-digital conversion on the analog output signal to obtain a digital feedback signal;

a third multiplier that multiplies the digital feedback signal by the first digital product signal to obtain a third digital product signal;

a first integrator that performs integration on the third digital product signal to obtain a first integral signal;

a fourth multiplier that multiplies the digital feedback signal by the second digital product signal to obtain a fourth digital product signal; and a second integrator that performs integration on the fourth digital product signal to obtain a second integral signal, wherein the first variable gain is controlled by the first integral signal, and the second variable gain is controlled by the second integral signal.

8. A power supply noise cancelling method, comprising:

generating a sine wave signal;

multiplying a digital input signal by a digital signal based on the sine wave signal to generate a first digital product signal;

subtracting a digital signal based on the first digital product signal from the digital input signal to generate a digital difference signal; and performing a digital-to-analog conversion on the digital difference signal to obtain an analog output signal.

\* \* \* \* \*